United States Patent [19]
Trinh et al.

[11] Patent Number: 5,136,186
[45] Date of Patent: Aug. 4, 1992

[54] GLITCH FREE POWER-UP FOR A PROGRAMMABLE ARRAY

[75] Inventors: Cuong Trinh, San Jose; Alex Shubat, Fremont, both of Calif.

[73] Assignee: WaferScale Integration, Incorporation, Fremont, Calif.

[21] Appl. No.: 752,733

[22] Filed: Aug. 30, 1991

[51] Int. Cl.$^5$ ............... H03K 19/003; H03K 19/0175
[52] U.S. Cl. .................................. 307/443; 307/465; 307/542
[58] Field of Search ............ 307/443, 465, 542, 557, 307/241, 242, 572

[56] References Cited

U.S. PATENT DOCUMENTS

3,560,765  2/1971  Kubinec .......................... 307/557 X

Primary Examiner—David Mis
Attorney, Agent, or Firm—Skjerven, Morrill, MacPherson, Franklin & Friel

[57] ABSTRACT

Dummy circuitry, including a dummy input buffer, associated lines, and an additional row in the PLD array, provides an additional input to the PLD to keep the voltage on the bit line low until the correct input signal has fully propagated through the working input buffer and associated lines, thereby preventing a voltage glitch.

19 Claims, 8 Drawing Sheets

GLITCH FREE POWER-UP FOR A PROGRAMMABLE ARRAY

FIELD OF THE INVENTION

This invention relates to a programmable logic device, and in particular to a programmable array with a glitch-free power-up.

BACKGROUND OF THE INVENTION

A relatively new type of programmable integrated circuit, called a Programmable System Device (PSD), includes an erasable programmable read-only memory (EPROM), a static random access memory (SRAM), a programmable logic device (PLD), and random control logic. The PLD within the PSD is used as an address decoder, selecting different devices outside and within the PSD for access and use. Because of its function, the PLD is also called a Programmable Mapping Decoder (PMD). The PMD provides signals, i.e. chip select output (CSO) signals, on off-chip output lines for selecting devices that are outside the PSD. The PMD also provides signals for internally selecting different blocks that are within the PSD, such as EPROMs, SRAMs and input/output (I/O) ports.

Figure 1:
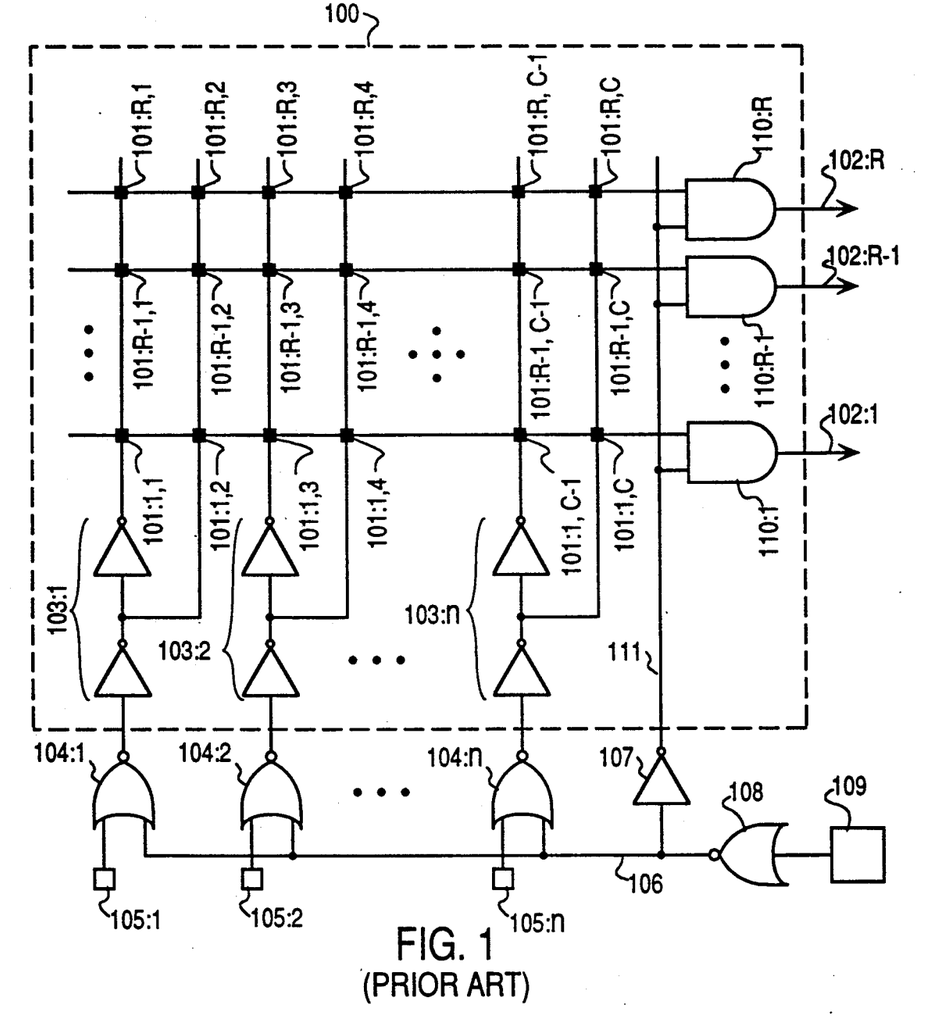
FIG. 1 illustrates a basic schematic of a generic prior art programmable logic device.

A generic PMD 100, as illustrated in FIG. 1, has an array 101 of programmable storage elements which may be EPROMs, electrically erasable read only memories (EEPROMs), static random access memories (SRAMs), flash EEPROMs, or read only memories (ROMs). Individual storage elements are identified by their respective rows and columns, where the total number of rows is R and the total number of columns is C. During a power-down mode, elements in the PMD, e.g. bit lines, sense amplifiers, nodes, or gates (not shown) are forced to predetermined low power states. In this manner, all elements drawing power will be forced to known states not drawing power.

For example, during a power-down mode, PMD100 is generally forced to a known state in two areas. First, an input signal is forced on line 106. In the illustrative generic configuration shown in FIG. 1, the power-down mode is triggered by a chip enable (CE) signal from pin 109. The power-down and the power-up modes are contingent upon this signal, not upon disconnection or connection to a voltages source, respectively. Note that PMD 100 may also be forced to a known state by forcing internal signals within the array 101 of programmable storage elements (which is not shown to simplify the figure). Second, the signals on lines 102 are forced to a known state. In the power-down mode, these output signals preferably result in a deselect state. Specifically, all devices driven by PMD 100 are "off". Note these output signals may be high or low. Hence, in summary, in the power-down mode, at least two areas of PMD100 are forced to particular values.

The power-up mode is typically accomplished using one of two methods. In one method, the power-up sequence is uncontrolled. In other words, all elements previously forced in the power-down mode are released at the same time. In this method, propagation times of the CE signal through each element in the PMD became critical. For example, referring to the specific elements in FIG. 1, depending on the circuitry (i.e. transistor-transistor-logic (TTL) circuits 104) and the layout (i.e. positioning-of buffer 107 in relation to TTL circuits 104 and input buffers 103), signals from the array 101 of programmable storage elements may reach the AND gates 110 after the signal from buffer 107 is received. Hence, the output signals from AND gates 110 on lines 102 go through transitions from the beginning of the power-up mode until the end of the power-up mode when all signals are stabilized. These signal transitions are called glitches. Note that even two PMDs identically designed may or may not have this problem due to temperature and power supply variations.

In another method to power-up, the power-up sequence is controlled. However, in this method, unnecessary time delays are generally introduced to ensure no glitches occur. For example, the forced signals on lines 102 (in this instance, forced by the signal on line 111) may be released only after signals propagated through input buffers 103 and array 101 are stabilized. In order for no glitches to occur, the delay time must be estimated conservatively. Hence, the introduction of unnecessary time delays.

Accordingly, there is a need for an improved programmable array which eliminates glitches without adding an unnecessary time delay.

SUMMARY OF THE INVENTION

In accordance with this invention, a programmable logic device (PLD) having a programmable mapping decoder (PMD) includes dummy circuitry which comprises a dummy input buffer, associated lines, and an additional row in a PMD array. This dummy circuitry provides an additional input to the PMD, i.e. a dummy input term, which clamps the voltage on a bit line to a predetermined range until the correct input signal has fully propagated through the working input buffer, associated lines, and PMD array, thereby preventing a voltage glitch. In one embodiment, the dummy circuitry is placed farthest from the PMD as compared to other PMD inputs to ensure an appropriate time delay for the working array to fully take over the function of the dummy PMD array, before the dummy PMD array is turned off, thereby preventing even a minor voltage glitch or an unnecessary time delay.

This invention will be more fully understood in conjunction with the following drawings.

DETAILED DESCRIPTION

In accordance with the present invention, the PMD includes dummy circuitry which prevents voltages glitches without unnecessary time delays. For purposes of illustration specific storage elements, circuitry, and PMD layout are described below. It is understood that although only one embodiment of the PMD is given that many embodiments (as mentioned previously in the Background of Invention) are envisioned and will be benefitted by the inclusion of the present invention.

The PMD array, in one embodiment, uses EPROM split gate technology, as disclosed in U.S. Pat. No. 5,021,847 issued to Eitan et al. on Jun. 4, 1991. An EPROM is characterized by having a floating gate to which there is no direct electrical connection and a control gate with a direct electrical connection. The floating gate is separated from the underlying substrate by a layer of insulating material, typically silicon dioxide. The substrate includes source and drain regions separated by a channel region below the floating gate. If the EPROM uses a split gate structure, a portion of the channel region is covered by the floating gate which in turn is covered by but insulated from the control gate, and the remaining portion of the channel region is covered by the control gate, as disclosed in U.S. Pat. No. 4,639,893 for example. The floating gate and control gate are also separated from each other by a layer of insulating material.

To program the EPROM, a high voltage is applied to the control gate and the drain of the EPROM while its source is grounded. This causes hot electron injection and allows negative charge (i.e. electrons) to accumulate on the floating gate. This negative charge remains after the high voltage is removed, thereby leaving the EPROM with a higher threshold voltage than that obtained without the negative charge on the floating gate; that is, for normal high and low voltages applied to the control gate the transistor remains in a continuous "off" state. In other words, as seen in U.S. Pat. No. 5,021,847, the EPROM will remain off even when a logic high is applied to its control gate.

Figure 2:
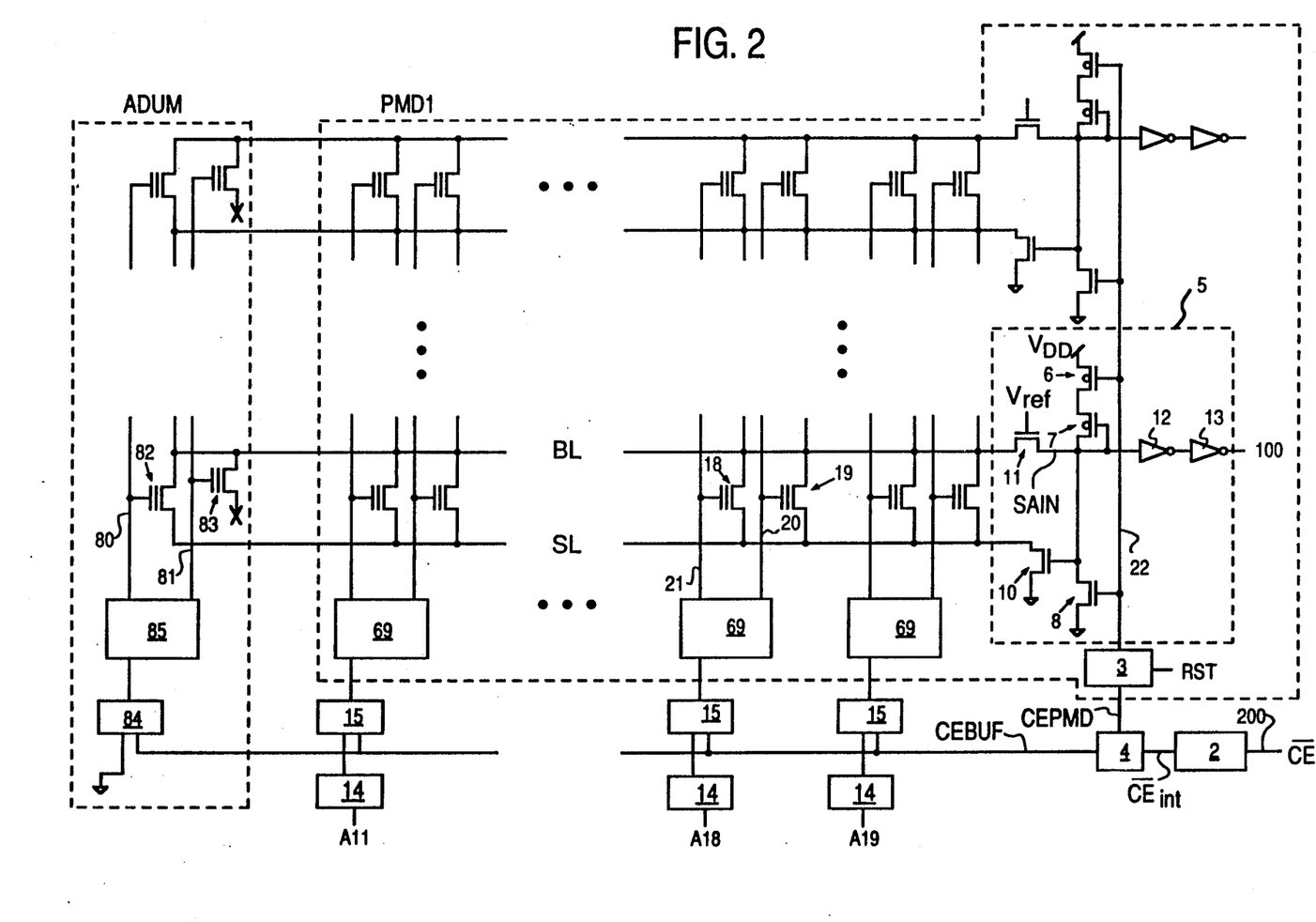
FIG. 2 illustrates a basic schematic of a programmable mapping decoder which incorporates a dummy circuit in accordance with the present invention.

In the embodiment shown in FIG. 2, an internal chip enable bar ($\overline{CE}_{int}$) signal, provided by CE circuit 2, enables or disables the PSD depending on whether the $\overline{CE}_{int}$ signal is low or high, respectively. This $\overline{CE}_{int}$ signal from CE circuit 2 is provided to control logic 4. Control logic 4 inverts this signal and transfers the inverted signal (indicated as signal CEPMD) to PMD 1 and also transfers another signal derived from $\overline{CE}_{int}$ (indicated as signal CEBUF) to an input buffer circuit described in detail later. Hence, a high signal $\overline{CE}_{int}$ becomes low signals CEPMD and CEBUF. The specific configuration of control logic 4 is well-known to those skilled in the art and, therefore, is not described in detail. Signal CEPMD is provided to control logic 3. In response to signal CEPMD, logic 3 generates a signal for powering-down or powering-up PMD1.

In the power-down mode, none of the memory blocks inside the PSD are selected to be activated. Additionally, other select output signals to external devices are also "off", i.e. deselect signals. This implies that the signal on PMD 1 output line 100, as determined by sense amplifier 5, has to be low in the power-down mode. Additionally, in this power-down mode, PMD 1 must not consume any power. Hence, during the power-down mode, sense amplifier 5 must be turned off and the sense amplifier output signal on line 100 will be low.

Turning off sense amplifier 5 is done in the power-down mode by sending a high signal on line 22 from circuit 3, thereby turning off P-type transistor 6 and turning on N-type transistor 8. The source of transistor 8 is connected to ground, while its drain is connected to sense amplifier input line SAIN. In this configuration, when transistor 8 is on, there is no transistor available to pull up sense amplifier input line SAIN (transistor 6 is off). Therefore, sense amplifier input line SAIN is pulled to ground by transistor 8.

With the path to $V_{DD}$ via transistor 6 disconnected, sense amplifier 5 draws no power. Having a low signal on line SAIN satisfies the condition that the PMD does not produce a high signal on lead 100 from inverter 13 and thus does not select or activate any internal or external memory device. In the power-down mode, the low voltage on sense amplifier input line SAIN is applied to the gate of N-type transistor 10, thereby turning off transistor 10. However, transistor 10 plays no role in the power-down mode because transistor 8 is already turned on.

The purpose of sense amplifier 5 is to sense the voltage on bit line BL. Bit line BL, as seen in FIG. 2, is heavily loaded with the capacitance from the circuitry in the PMD array of which only PMD cells 18 and 19 are numbered. (All PMD cells, circuitry, and sense amplifiers are replicated as indicated in FIG. 2, but are not numbered to simplify the figure.) The voltage on bit line BL changes relatively slowly because of this capacitance. Waiting for bit line BL to swing to either zero or five volts from a previous state, as is the case in typical CMOS technology, would result in an unacceptable time delay. Therefore, during normal operation, bit line BL is clamped between a low level of one volt and a high level of two volts.

During the power-down mode, the input buffer circuit 15 must not draw any current even when its inputs are at the TTL level i.e. between 0.8 and 2.0 volts. (However, CE circuit 2 does draw current at the TTL level during the power-down mode.) To ensure that input buffer circuit 15 draws no current while the voltage on line 200 is high (i.e. power down signal), and the input of input buffer circuit 15 is at the TTL level, a two input NOR gate (later described in detail and shown as NOR gate 50 in FIG. 4) is provided. The two input signals of the NOR gate are CEBUF and an input signal from pad 14. During the power-down mode, signal CEBUF is controlling and forces the PMD input signals via circuit 69 on lines 20 and 21 to a particular voltage level, irrespective of the pad 14 input. Specifically, circuit 69 generates a signal on line 20 of the same logic level as the output signal from the NOR gate, and inverts this signal on line 21 These signals will not turn on PMD cells 18 or 19 because these PMD cells have either been programmed to require a higher turn on voltage or the input signals to the PMD cells are "off", i.e. deselect. Although N-type transistor 11 is "on," it serves no active function in the power-down mode.

However, a problem arises in bringing this device (i.e. without the dummy circuitry of this invention) out of the power-down mode ($\overline{CE}$ signal goes low). Note that the bit line BL, the sense amplifier input line SAIN and the signals on lines 20 and 21 are being forced to a determined value by signal $\overline{CE}$ generated by circuit 2. When $\overline{CE}$ goes low, thus enabling the PMD, sense amplifier 5 may momentarily sense a wrong set of forced inputs (refer also to FIG. 1 in which signals on lines 102 are forced) before settling to the appropriate value and thus briefly produce an erroneous output signal. Specifically, a glitch occurs.

Figure 9A:
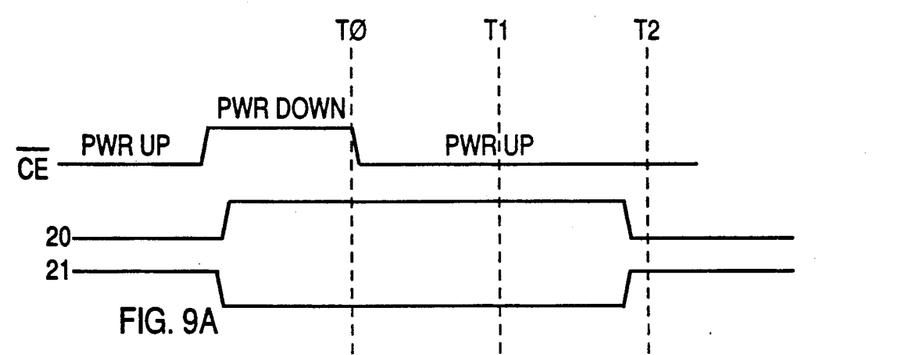
FIG. 9A shows specific signal values in the PMD according to power-down or power-up conditions.

For example, assume that PMD cell 19 is programmed to a high threshold voltage, PMD cell 18 is programmed to a low threshold voltage, and the signal on line A18 is low. When a power-up mode is initiated at time $T_0$ (see FIG. 9A), the $\overline{CE}_{int}$ signal from CE circuit 2 goes low. Low signal $\overline{CE}_{int}$ propagated through control logic 4 and 3, results in a low signal on line 22, thereby turning on transistor 6 and turning off transistor 8. During the initial portion of the power-up mode, transistor 7 is also on because the voltage on SAIN is low from the power-down mode. Therefore, current flows through both transistors 6 and 7 and quickly begins to pull up sense amplifier input line SAIN.

Meanwhile, the low $\overline{CE}_{int}$ signal, inverted by control logic 4, becomes high signal CEBUF. During the power-up mode, the signal on line A18 connected to pad 14 is low. The pad 14 signal and high signal CEBUF, propagated through input buffer circuit 15 and circuit 69, result in a high signal on line 21 being applied to the gate of PMD cell 18 which turns it on. Note that transistor 10 has also turned on due to the high voltage on sense amplifier input line SAIN. Transistor 10, when on, pulls down the source line SL to approximately ground.

Figure 3:
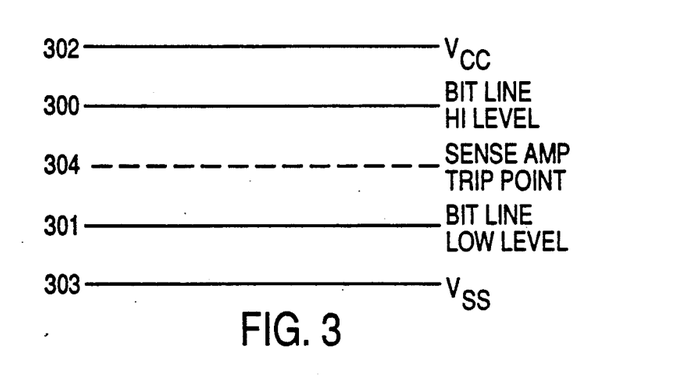
FIG. 3 illustrates the voltages of the bit line at high and low levels relative to a voltage source, ground, and the sense amplifier trip point.

Because transistor 11 is always on, the voltage on sense amplifier input line SAIN provided by transistors 6 and 7 will be pulled down toward ground by PMD cell 18 and transistor 10. Sense amplifier input line SAIN is pulled down to approximately 1.5 volts which is below the trip point (i.e. the transition voltage below which sense amplifier 5 outputs a low signal and above which sense amplifier 5 outputs a high signal). The trip point of bit line BL is approximately 1.5 volts whereas the trip point of line SAIN is approximately 2.5 volts. FIG. 3 illustrates the voltages of the bit line BL at a high level 300 and at a low level 301 relative to the voltage source $V_{cc}$ 302 ground $V_{ss}$ 303, and the sense amplifier trip point 304.

Figure 9B:
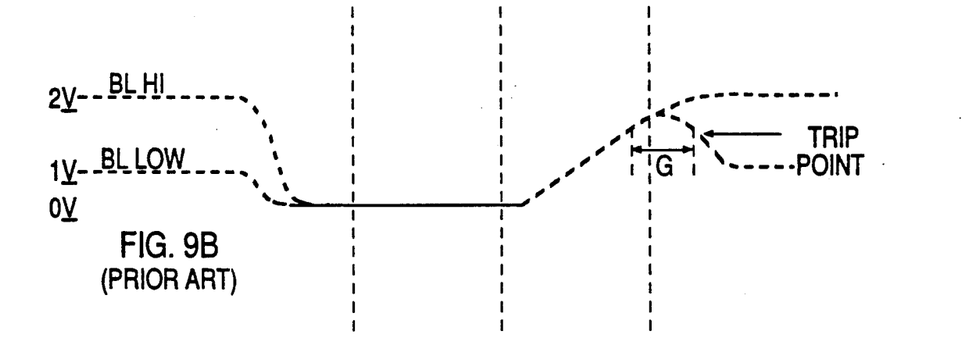
FIG. 9B illustrates the voltage glitch on the bit line occurring in relation to designated time intervals in the device of FIG. 2 in which dummy circuitry is not included.

The delay time for a signal to propagate through input buffer circuit 15 and circuit 69 beginning at time $T_0$ is equal to $T_2$, which is illustrated in FIG. 9B, because buffer circuit 15 was previously forced to its power-down state. However, the delay time of a signal to propagate through control logic 3 is equal to $T_1$, where $T_1$ is less than $T_2$. Hence, at time $T_1$, the voltage on sense amplifier input line SAIN is pulled up beyond its optimal level during high speed operation (see FIG. 3, sense amp trip point 304) before it can be pulled down by PMD cell 18 and transistor 10. This voltage overshoot, or glitch, on the bit line BL has a duration G as shown in FIG. 9B.

If the output signal of this device is used to enable other portions of the circuit i.e. selecting memory blocks, glitches in the output signal may cause more than one portion of the circuit to be on at one time. If output signals of these "on" portions are driving the same bus, more than one output signal driving the bus will cause bus contention, thereby possibly producing an undesirable power surge which causes unwanted power consumption and noise. Additionally, if these output signals generate chip select output signals (CSO's) which drive off-chip devices, then unwanted power will be consumed in the output drivers, thereby generating noise inside the chip.

Figure 9C:
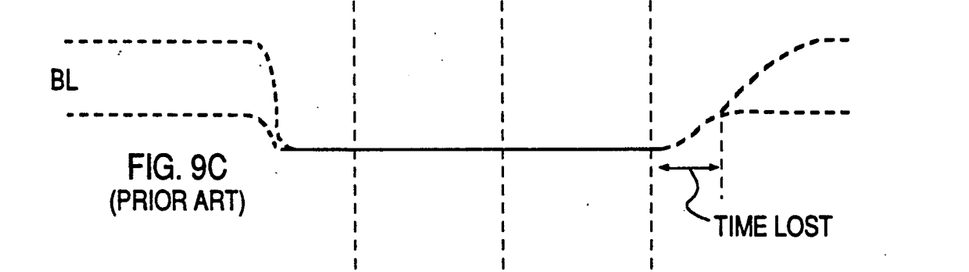
FIG. 9C illustrates an unsatisfactory solution to the problem shown in FIG. 8B.

One proposed solution to the voltage glitch problem, as noted previously, seen in FIG. 9C, is to clamp down the value of bit line BL for a predetermined amount of time. However, because this predetermined amount of time must be estimated conservatively, valuable time is lost in the process.

$\overline{CE}$ circuit 2, control logic 3, input buffer circuit 15, and circuit 69, as shown in FIG. 2, are now explained in further detail to aid in understanding one embodiment of the present invention. Additionally, the function of N-type transistor 11 is described in detail.

Figure 4:
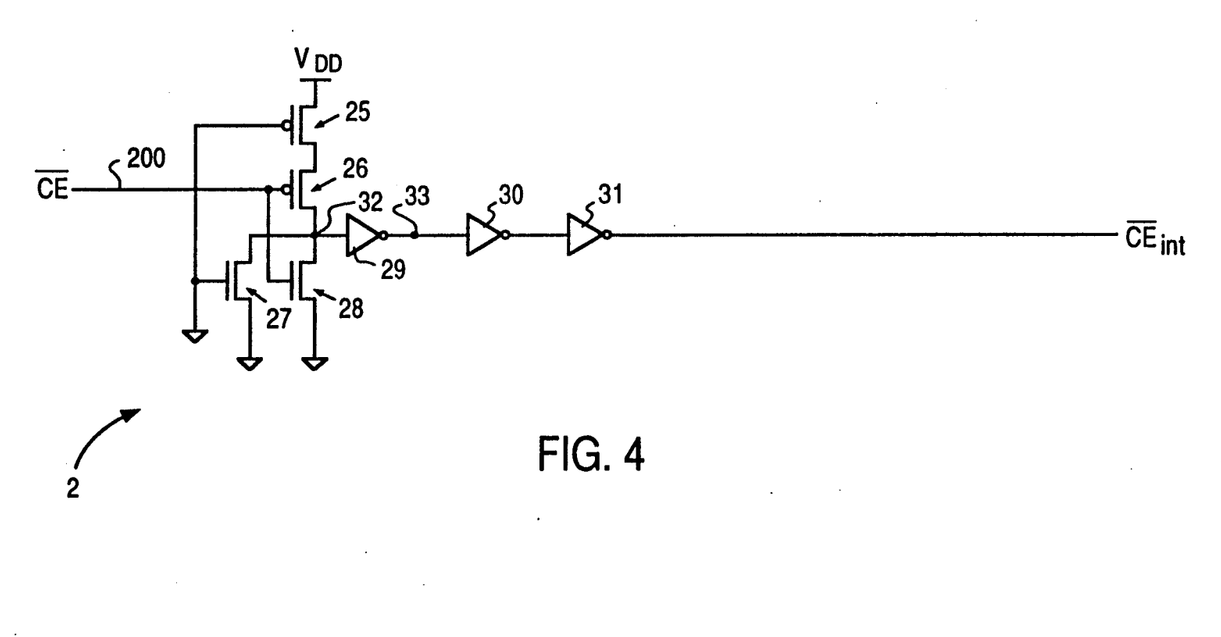
FIG. 4 shows a typical chip enable circuit.

FIG. 4 shows an illustrative CE circuit 2 with input line 200. CE circuit 2 includes a standard CMOS NOR gate comprising P-type transistors 25, 26 and N-type transistor 27, 28. These transistors are sized to provide a transistor-transistor-logic (TTL), i.e. between 0.8 V and 2.0 V, to CMOS, i.e. zero to 5.0 volts, translation. A high input signal, i.e. $\overline{CE}$, on line 200 applied to the gates of transistors 26, 28 yields a low signal on node 32. This low signal, inverted by inverters 29, 30, and 31 provides a high $\overline{CE}_{int}$ (internal) output signal. A more detailed configuration for this CE circuit was disclosed in U.S. Pat. No. 4,961,172, issued to Shubat et al. on Oct. 2, 1990.

Figure 5:
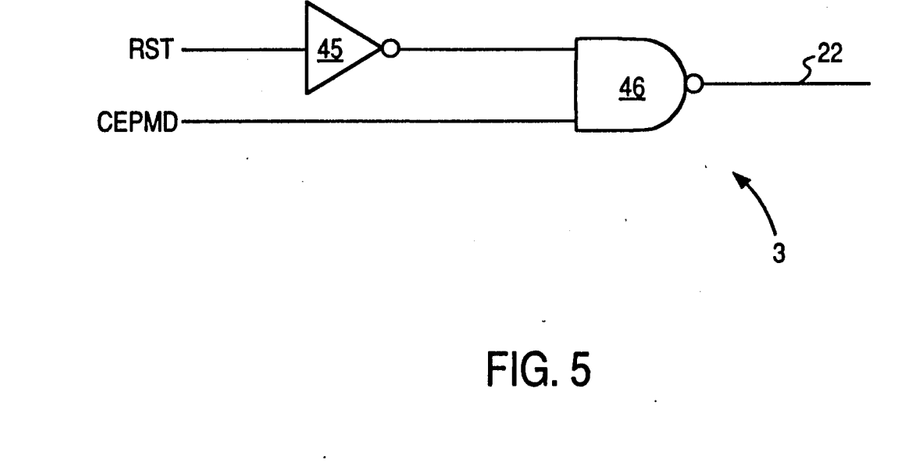
FIG. 5 illustrates a typical control circuit that receives a propagated chip enable signal.

FIG. 5 illustrates one example of control logic 3. During the power-down mode, a low CEPMD signal is input to NAND gate 46. Hence, a high signal is output on line 22.

Figure 6:
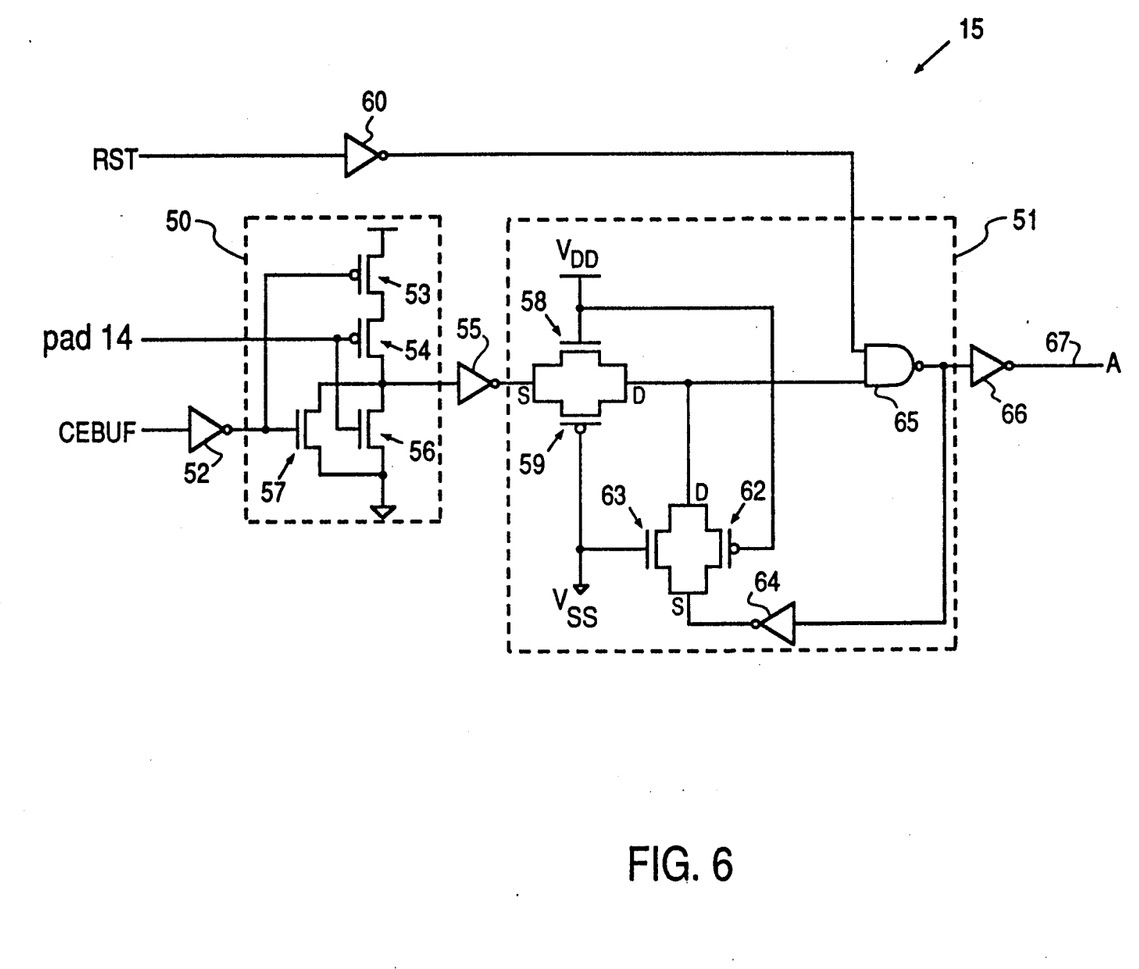
FIG. 6 shows input signals provided to a NOR gate, latch, and inverter which result in an internal address signal A.

FIG. 6 shows NOR gate 50 of input buffer circuit 15 at a transistor level comprising P-type transistors 53, 54 and N-type transistors 56, 57. In the power-down mode, NOR gate 50 has two input signals: a signal from pad 14 shown in FIG. 1, and low signal CEBUF, which is inverted by inverter 52. The output signal of NOR gate 50, inverted by inverter 55, is then transferred to latch 51 which is shown at transistor level comprising P-type transistors 59, 62, N-type transistors 58, 63, inverter 64 and NAND gate 65. The latch is in the transparent, i.e. open, mode for simplicity. The reset signal RST is assumed to be low for both the power-down and power-up modes for simplicity and is inverted by inverter 60 before being input into NAND gate 65. The CEBUF signal propagated through the above logic is inverted by inverter 66 and becomes a high address signal A.

Figure 7:
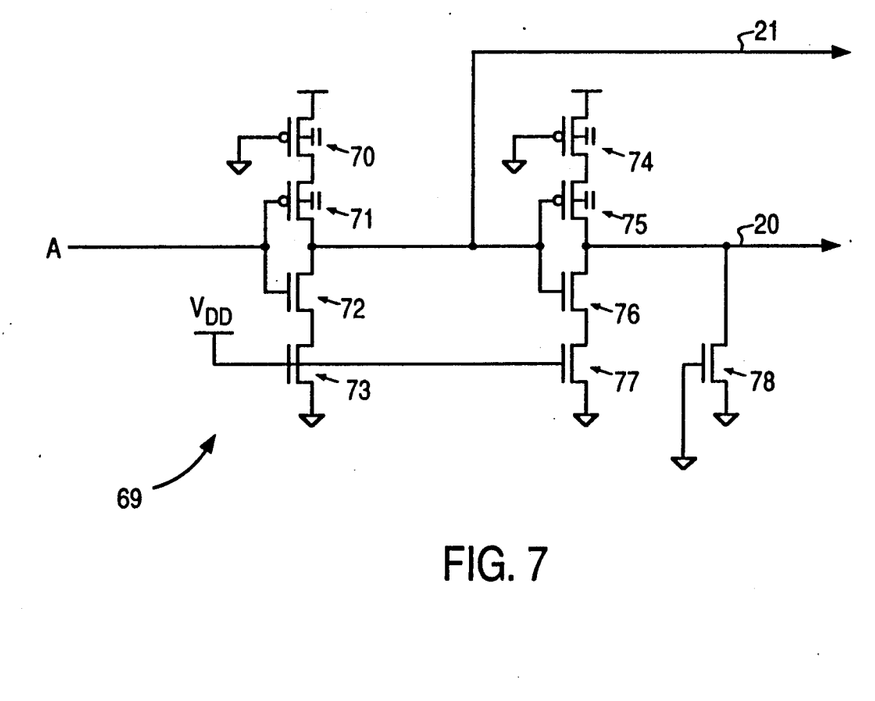
FIG. 7 illustrates a typical set of inverters connected to the circuit shown in FIG. 6.

Address signal A is applied to the gates of P-type transistor 71 and N-type transistor 72 of circuit 69 shown in FIG. 7. To simplify the figure, the gates of P-type transistors 70, 74 and N-type transistor 78 are connected to ground, thereby turning transistors 70, 74 on and transistor 78 off. In a similar manner, the gates of N-type transistors 73, 77 are shown connected to voltage source $V_{DD}$ and, therefore, are turned on. Transistors 70–73 function as a tri-statable inverter. Transistors 74–77 function in the same manner and, therefore, are not described in detail. Thus, a high signal A provides a low signal on line 21 and a high signal on line 20.

N-type transistor 11 of FIG. 2 serves as an amplifier in sense amplifier 5 which permits the voltage on line SAIN to vary from approximately 1.5 volts to 4.0 volts. In the structure of FIG. 2, the gate voltage provided by $V_{ref}$ is typically 3 V and the threshold voltage of N-type transistor 11 is 1 V. In the power-down mode, the source voltage of transistor 11 (bit line BL) is zero. Additionally, the line SAIN is pulled low by transistor 8. Because the source and the drain of transistor 11 are both at ground, there is no power being dissipated by transistor 11 or the storage element array. This is in fact how signals on bit line BL and line SAIN are forced to ground. Hence, N-type transistor 11 is "on" because the gate to source voltage (3-0 V) is greater than the threshold voltage of the transistor (1 V). Transistors 6, 7, 10 and 11 are sized in relation to PMD cells 18 and 19 to achieve the proper amplification. Specifically, if line SAIN is at four volts, then bit line BL can go no higher than two volts without turning off transistor 11. Additionally, bit line BL is prevented from going lower than one volt because transistor 10 will turn off.

Figure 8:
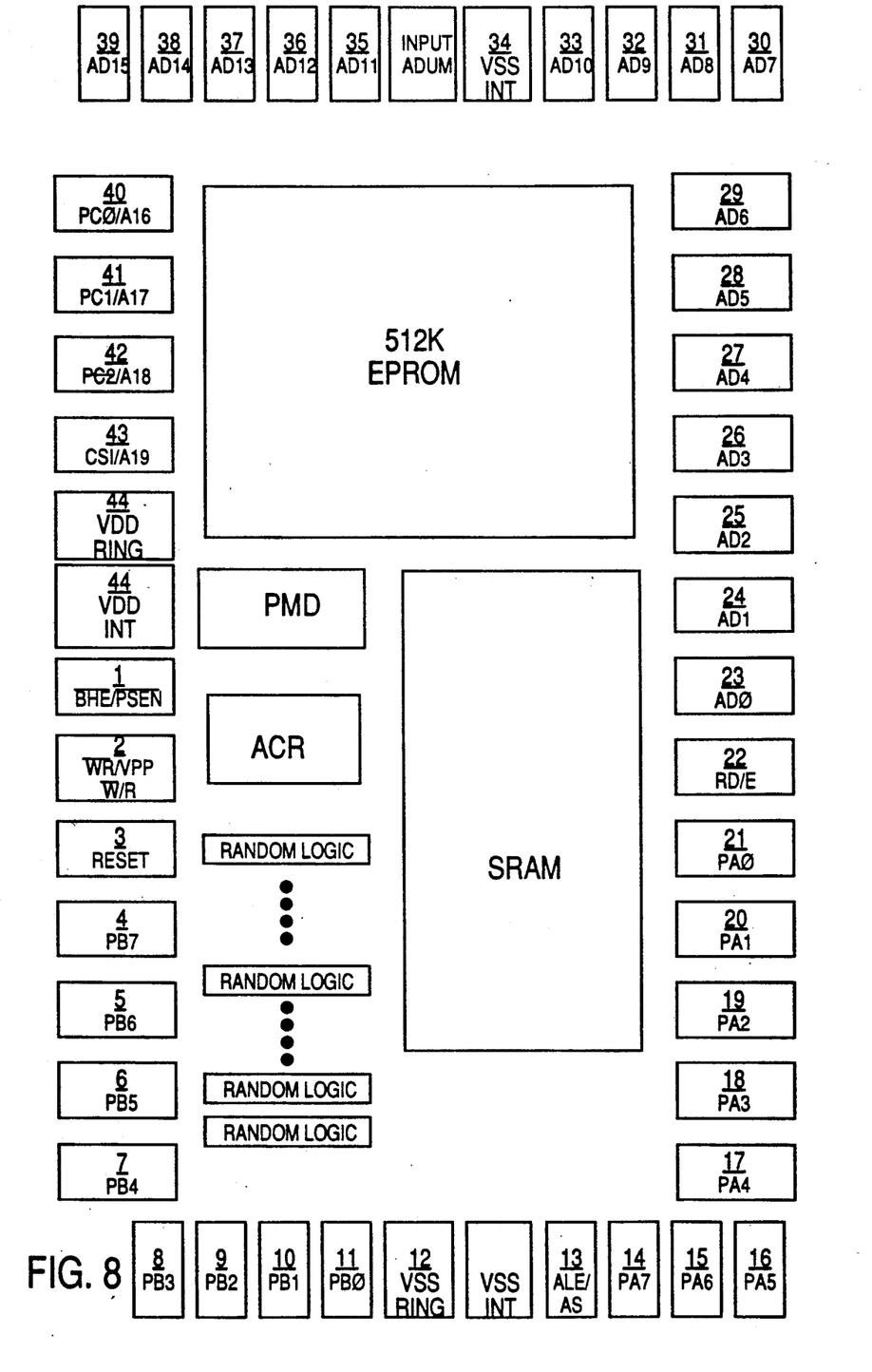
FIG. 8 shows in block diagram form an illustrative configuration for a programmable system device.

In accordance with the present invention, a dummy circuit ADUM, shown in FIG. 2, keeps bit line BL at a low level voltage range, i.e. between ground $V_{ss}$ 303 and the sense amplifier trip point 304 (typically at low level 301), referring to FIG. 3, until time $T_2$, thereby preventing a voltage glitch. Dummy circuit ADUM contains an input buffer circuit 84 and circuit 85 with associated lines 80 and 81 identical to input buffer 15, circuit 69 and associated lines 20 and 21. Input buffer circuit 84 is located further from the array than input buffer 15, this dummy delay should be the same as or greater than the real delay associated with buffer 15, and all similarly situated buffers (as indicated in FIG. 8, see block input ADUM which includes input buffer circuit 84 (Note AD11, adjacent to ADUM, includes input buffer 15)) which may be used in the PMD 1 under all processing and operating conditions. Note circuit 85, lines 80 and 81, and PMD cells 82 and 83 are included in the dummy circuitry in PMD1. Input buffer 84 to this dummy circuitry is shown as input ADUM in FIG. 8.

Both PMD cells 82 and 83 in dummy circuit ADUM have a low threshold value (i.e. are unprogrammed). Therefore, during the power-down mode, the low CEBUF signal passing through input buffer circuit 84 and circuit 85 results in a high signal applied to the gate of PMD cell 82 via line 80 and a low signal applied to the gate of PMD cell 83 via line 81. These signals turn on PMD cell 82 and leave off PMD cell 83. However, bit line BL and input line SAIN are held low by transistor 8 being on (due to the high signal on line 22) and clamping SAIN and BL (through transistor 11) to ground. Hence, PMD cells 82, B3, input buffer line 84, and circuit 85, like PMD cells 18, 19, input buffer line 15, and circuit 69, play no active role in the power-down mode.

However, during the initial portion of the power-up mode, when $\overline{CE}$ goes low propagated through circuits 2, 4, and 3, but before $\overline{CE}$ low has propagated through input buffer circuit 15, circuit 69 or circuit 84 and circuit 85, transistors 6 and 7 will start to pull the voltage on line SAIN high. However, PMD cell 82 is still on from the power-down mode and therefore prevents the voltage on line SAIN from going higher than approximately one volt, which is the bit line low level 301 in FIG. 3.

This pull-down occurs from time $T_1$ until at least time $T_2$, when low $\overline{CE}$ signal has propagated through input buffer circuit 84 and circuit 85, resulting in a low signal applied to the gate of PMD cell 82, thereby turning it off. Because PMD cell 83 is not connected to source line SL, PMD cell 83 plays no role in either the power-down or power-up mode, but is used for proper loading on dummy circuit ADUM. At time $T_2$, the proper value of the input has propagated to the array, with PMD cell 82 off, line SAIN is free to go high or remain low depending on the programmed status of the array.

In accordance, with one embodiment of the present invention, the input i.e., input buffer 84, to dummy circuit ADUM (as seen in FIG. 8) is placed farthest from PMD 1 as compared to the other PMD inputs, i.e. lines A11–A19 (see pads 35–43 in FIG. 8). This ensures an appropriate time delay for the actual array to fully take over the function of PMD cell 82, before PMD cell 82 is turned off, thereby preventing even a minor voltage glitch. In other words, the dummy circuit overrides storage elements 18 and 19. FIG. 8 shows in block diagram form an illustrative configuration for a PSD. Note the input to dummy circuit ADUM is located farther from the PMD than input lines A11–A19. For additional information regarding the operation of a PSD in which a dummy circuit in accordance with the present invention is used, reference is made to the "Programmable System Device PSD302 Data Sheet," copyrighted 1991, available from WaferScale Integration, Inc., Fremont, Calif., which is hereby incorporated by reference in its entirety.

Figure 9D:
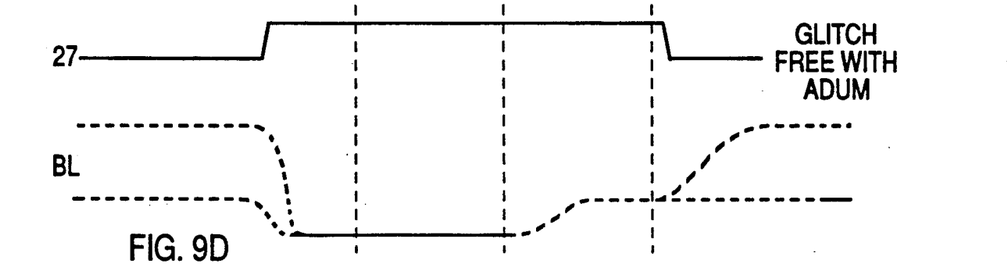
FIG. 9D shows the voltage on the bit line as a function of time in accordance with the present invention.

The present invention also minimizes access time when compared to the prior art. In FIG. 9D, the voltage on bit line BL is allowed to reach an intermediate level before time $T_2$. Therefore, there is no time loss associated with power-up because the voltage on bit line BL rises to its highest level quicker than if the voltage were clamped at zero until after $T_2$ (as seen in FIG. 8C).

The proceeding description is meant to be illustrative only and not limiting. For example, this structure can be used in a stand-alone PLD device as well as in a PMD as described above. Those skilled in the art will be able to fabricate other devices in accordance with this invention based on the above description.

We claim:
1. Structure comprising:
 a signal line connected to a circuit for driving said circuit;
 a first plurality of storage elements connected to said signal line;
 means for clamping said signal line at a first specified signal level for a selected time during power-down of said structure; and
 means for maintaining said signal line at a predetermined signal range for a selected time during power-up of said structure to prevent said signal line from developing a voltage glitch during power-up.
2. Structure as in claim 1 wherein said means for maintaining said signal line at said predetermined signal range comprises a dummy circuit connected to said signal line.
3. Structure as in claim 2 wherein said dummy circuit is deactivated after all said first plurality of storage elements have been activated during power-up.
4. Structure as in claim 2 wherein each of said first plurality of storage elements comprises an input line;
 wherein said dummy circuit comprises an input line;
 wherein said input line of said dummy circuit is positioned relative to one of said input lines of said first plurality of storage elements such that said dummy circuit is deactivated after all said first plurality of storage elements have been activated during power-up.

5. Structure as in claim 2 wherein said predetermined signal range is achieved by said dummy circuit overriding said first plurality of storage elements to provide said specified signal level.

6. Structure as in claim 5 wherein said predetermined signal range is between said first specified signal level and a second specified signal level.

7. Structure as in claim 6 wherein said second specified signal level is a maximum value which is a trip point of said circuit.

8. Structure as in claim 7 wherein said circuit is a sense amplifier.

9. Structure of claim 7 wherein said dummy circuit comprises a second plurality of storage elements, each of said second plurality of storage elements having a substantially similar configuration to said first plurality of storage elements.

10. Structure as in claim 1 wherein said means for maintaining is positioned relative to said first plurality of storage elements such that said means for maintaining is deactivated after all said plurality of storage elements have been activated during power-up.

11. Structure comprising:
a signal line connected to a circuit for driving said circuit;
a first plurality of storage elements connected to said signal line;
means for clamping said signal line at a first specified signal level for a selected time during power down of said structure: and
a second plurality of storage elements for maintaining said signal line at a predetermined signal range for a selected time during power-up of said structure to prevent said signal line from developing a voltage glitch during power-up.

12. Structure as in claim 11 wherein said second plurality of storage elements are connected to said signal line.

13. Structure as in claim 12 wherein said second plurality of storage elements are deactivated after all said first plurality of storage elements have been activated during power-up.

14. Structure as in claim 12 wherein each of said first plurality of storage elements comprises an input line;
wherein each of said second plurality of storage elements comprises an input line;
wherein said input lines of said second plurality of storage elements are positioned relative to said input lines of said first plurality of storage elements such that said second plurality of storage elements are activated after all said first plurality of storage elements have been activated during power-up.

15. Structure as in claim 12 wherein said predetermined signal range is achieved by said second plurality of storage elements overriding said first plurality of storage elements to provide said predetermined signal range.

16. Structure as in claim 15 wherein said predetermined signal range is between said first specified signal level and a second specified signal level.

17. Structure as in claim 16 wherein said second specified signal level is a maximum value which is a trip point of said circuit.

18. Structure as in claim 17 wherein said circuit is a sense amplifier.

19. Structure of claim 17 wherein said second plurality of storage elements have a substantially similarly configuration to said first plurality of storage elements.

* * * * *